United States Patent
Schnobrich et al.

(12) 
(10) Patent No.: US 7,948,016 B1
(45) Date of Patent: May 24, 2011

(54) OFF-CENTER DEPOSITION OF ORGANIC SEMICONDUCTOR IN AN ORGANIC SEMICONDUCTOR DEVICE

(75) Inventors: Scott M. Schnobrich, Cottage Grove, MN (US); Robert S. Clough, Saint Paul, MN (US); Dennis E. Vogel, Lake Elmo, MN (US); Michael E. Griffin, Maplewood, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 46 days.

(21) Appl. No.: 12/611,556

(22) Filed: Nov. 3, 2009

(51) Int. Cl.
*H01L 29/76* (2006.01)
*H01L 23/58* (2006.01)

(52) U.S. Cl. ............ 257/286; 257/40; 257/66; 257/285; 257/287; 257/E21.404; 257/E21.411; 257/E21.409; 257/E21.633; 257/E21.703; 257/E29.273; 438/149; 438/151; 438/158

(58) Field of Classification Search .................... 257/40, 257/66, 285, 286, 287, E21.404, E21.411, 257/E21.409, E21.633, E21.703, E29.273; 438/149, 151, 158
See application file for complete search history.

(56) References Cited

U.S. PATENT DOCUMENTS

| | | | |
|---|---|---|---|
| 6,690,029 B1 | 2/2004 | Anthony et al. | |
| 7,514,710 B2 | 4/2009 | Vogel et al. | |
| 7,795,083 B2 * | 9/2010 | Tsai et al. | 438/186 |
| 7,880,202 B2 * | 2/2011 | Baumgartner | 257/286 |
| 2004/0222412 A1 | 11/2004 | Bai et al. | |
| 2007/0146426 A1 | 6/2007 | Nelson et al. | |
| 2007/0252229 A1 * | 11/2007 | Fujimori et al. | 257/489 |
| 2009/0224292 A1 | 9/2009 | Asano et al. | |

FOREIGN PATENT DOCUMENTS

| | | |
|---|---|---|
| JP | 2006-261423 | 9/2006 |
| WO | WO 2005/055248 A2 | 6/2005 |
| WO | WO 2007/135911 | 11/2007 |
| WO | WO 2008/114564 A1 | 9/2008 |

OTHER PUBLICATIONS

Lim, Jung Ah, Lee, Wi Hyoung, Lee, Hwa Sung, Lee, Ji Hwang, Park, Yeong Don, and Cho, Kilwon; "Self-Organization of Ink-Jet-Printed Triisopropylsilylethynyl Pentacene Via Evaporation-Induced Flows In A Drying Droplet", Advanced Functional Materials, 2008, vol. 18, pp. 229-234.

Klauk, Hagen, Gundlach, David JI, Nichols, Jonathan A., and Jackson, Thomas N.; "Pentacene Organic Thin-Film Transistors for Circuit and Display Applications", IEEE Transactions on Electron Devices, vol. 46, No. 6, Jun. 1999, pp. 1258-1263.

(Continued)

*Primary Examiner* — Dao H Nguyen
(74) *Attorney, Agent, or Firm* — Philip Y. Dahl

(57) ABSTRACT

The present disclosure provides a method of making a thin film semiconductor device such as a transistor comprising the steps of: a) providing a substrate bearing first and second conductive zones which define a channel therebetween, where the channel does not border more than 75% of the perimeter of either conductive zone; and b) depositing a discrete aliquot of a solution comprising an organic semiconductor adjacent to or on the channel, where a majority of the solution is deposited to one side of the channel and not on the channel. In some embodiments of the present disclosure, the solution is deposited entirely to one side of the channel, not on the channel, and furthermore the solution is deposited in a band having a length that is less than the channel length. The present disclosure additionally provides thin film semiconductor devices such as a transistors.

27 Claims, 4 Drawing Sheets

OTHER PUBLICATIONS

Meijer, E. J., Detcheverry, C., Baesjou, P. J., van Veenendaal, E., and de Leeuw, D. M, and Klapwijk, T. M.; "Dopant Density Determination in Disordered Organic Field-Effect Transistors", Journal of Applied Physics, vol. 93, No. 8, Apr. 15, 2003, pp. 4831-4835.

Vogel. D. E. and Anthony, J.; "Silylethynyl Pentacene Compounds and Compositions and Methods of Making and Using the Same", U.S. Appl. No, 61/057,715, filed May 30, 2008.

Clough, R. S.; "Mixed Solvent Systems for Deposition of Organic Semiconductors", U.S. Appl. No. 61/060,595, filed Jun. 11, 2008.

Clough, R. S. And Schnobrich, S. M.; "Methods of Fabricating Organic Semiconductive Layers", U.S. Appl. No. 61/076,186, filed Jun. 27, 2008.

International Search Report PCT/US2009/063099, Intl. Filing, date: Nov. 3, 2009. (Form PCT/ISA/210).

* cited by examiner

OFF-CENTER DEPOSITION OF ORGANIC SEMICONDUCTOR IN AN ORGANIC SEMICONDUCTOR DEVICE

FIELD OF THE DISCLOSURE

This invention relates to the manufacture of organic semiconductor devices by inkjet printing or similar fluid deposition processes and the devices so made.

BACKGROUND OF THE DISCLOSURE

In recent years there has been an increasing research effort aimed at using organic materials as semiconductors rather than the traditional inorganic materials such as silicon and gallium arsenide. Among other benefits, the use of organic materials may enable lower cost manufacturing of electronic devices, may enable large area applications, and may enable the use of flexible substrates as supports for electronic circuitry in display backplanes, integrated circuits RFID tags, and sensors.

A variety of organic semiconductor materials have been considered, the most common being fused aromatic ring compounds as exemplified by acenes. At least some of these organic semiconductor materials have performance characteristics such as charge-carrier mobility, on/off current ratios, and sub-threshold voltages that are comparable or superior to those of amorphous silicon-based devices. These materials have often been vapor deposited since they are not very soluble in most solvents. When organic semiconductors have been deposited from solution (such as in a solution with an organic solvent), good or optimum performance characteristics have been difficult to achieve.

U.S. Pat. No. 6,690,029 B1 purportedly discloses certain substituted pentacenes and electronic devices made therewith.

WO 2005/055248 A2 purportedly discloses certain substituted pentacenes and polymers in top gate thin film transistors.

U.S. patent application Ser. No. 11/275,366 filed Dec. 28, 2005, the disclosure of which is incorporated herein by reference, generally discloses an all-inkjet printed thin film transistor and methods of making and using same. The following references may be relevant to inkjet printing of organic semiconductors: Lim et al, "Self-Organization of Ink-jet-Printed Triisopropylsilylethynyl Pentacene via Evaporation-Induced Flows in a Drying Droplet," Adv. Funct. Mater., 2008, 18, pp. 229-234.

Some report using unusual device geometries with organic semiconductor materials, e.g. concentric ring or Corbino geometries. The following references may be relevant to such a technology: Klauk et al., "Pentacene Organic Thin-Film Transistors for Circuit and Display Applications," IEEE Transactions on Electron Devices, Vol. 46, No. 6, June 1999, pp. 1258-1263; Meijer et al., "Dopant density determination in disordered organic field-effect transistors," J. App. Physics, Vol. 93, No. 8, 15 Apr. 2003, pp. 4831-4835.

U.S. patent application Ser. No. 11/275,367, filed Dec. 28, 2005, the disclosure of which is incorporated herein by reference, generally discloses thin film transistor with bottom-gate geometry and methods of making and using same.

U.S. Provisional Pat. App. No. 61/057,715, filed May 30, 2008, the disclosure of which is incorporated herein by reference, generally discloses silylethynyl pentacenes, compositions containing silylethynyl pentacenes, and methods of making and using silylethynyl pentacenes, e.g. as organic semiconductors.

U.S. Provisional Pat. App. No. 61/060,595, filed Jun. 11, 2008, the disclosure of which is incorporated herein by reference, generally discloses the use of mixed solvent systems for deposition of organic semiconductors.

U.S. Provisional Pat. App. No. 61/076,186, filed Jun. 27, 2008, the disclosure of which is incorporated herein by reference, generally discloses methods of growing organic semiconductive layers; methods of fabricating organic semiconductor devices; and layers and devices formed thereby.

SUMMARY OF THE DISCLOSURE

The present disclosure provides a method of making a thin film semiconductor device comprising the steps of: a) providing a substrate bearing first and second conductive zones, wherein the first and second conductive zones define a channel therebetween, and wherein the channel does not border more than 75% or in some embodiments 50% of the perimeter of either conductive zone; and b) depositing a discrete aliquot of a solution comprising an organic semiconductor adjacent to or on the channel, where the aliquot provides organic semiconductor to a single thin film semiconductor device, where a majority of the solution is deposited to one side of the channel and not on the channel. In some embodiments the boundaries between the channel and each of the conductive zones are substantially linear and substantially parallel. In some embodiments the thin film semiconductor device is a transistor, the first conductive zone is a source and the second conductive zone is a drain. In some embodiments more than 60% of the solution is deposited to one side of the channel and not on the channel, in some more than 70%, in some more than 80%, in some more than 90%, in some 100%. In some embodiments the discrete aliquot is deposited in the form of a plurality of droplets, typically by inkjet printing. In some such embodiments, at least 60% of the droplets are deposited to one side of and not on the channel, in others at least 70%, in others at least 80%, in others at least 90%, in others 100% In some embodiments, the discrete aliquot of a solution comprising an organic semiconductor is allowed to wet out after deposition and thereupon has a length that is not more than 10 times the channel length. In some embodiments, the discrete aliquot of a solution comprising an organic semiconductor is deposited in a band having a length that is less than the channel length.

In some embodiments of the present disclosure, the discrete aliquot of a solution comprising an organic semiconductor is deposited entirely to one side of the channel, not on the channel, and furthermore the solution is deposited in a band having a length that is less than the channel length. Such a method not only functions but provides improved results.

The present disclosure additionally provides a thin film semiconductor device, which comprises: a) a substrate bearing first and second conductive zones, wherein the first and second conductive zones define a channel therebetween, and wherein the channel does not border more than 75% or in some embodiments 50% of the perimeter of either conductive zone; and b) a discrete semiconductor layer comprising an organic semiconductor on and adjacent to the channel, where the discrete semiconductor layer serves a single thin film semiconductor device, where a majority of the discrete semiconductor layer lies to one side of and not on the channel. In some embodiments the boundaries between the channel and each of the conductive zones are substantially linear and substantially parallel. In some embodiments the thin film semiconductor device is a transistor, the first conductive zone is a source and the second conductive zone is a drain. In some embodiments, the device additionally comprises a gate and a dielectric layer. In some embodiments, more than 55% of the discrete semiconductor layer lies to one side of and not on the channel, in others more than 60%, in others more than 65%, in others more than 70%, in others more than 75%, in others more than 80%. In some embodiments the discrete semiconductor layer has a length that is not more than 10 times the channel length.

The present disclosure additionally provides a method of making a thin film semiconductor device pair comprising the steps of: a) providing a substrate bearing i) first and second conductive zones, wherein the first and second conductive zones define a first channel therebetween; and ii) third and fourth conductive zones, wherein the third and fourth conductive zones define a second channel therebetween; and b) depositing a discrete aliquot of a solution comprising an organic semiconductor adjacent to or on the first and second channels, where the aliquot provides organic semiconductor to exactly two single thin film semiconductor devices, where a majority of the solution is deposited to one side of the first channel and not on the first channel, and where a majority of the solution is deposited to one side of the second channel and not on the second channel.

The present disclosure additionally provides a thin film semiconductor device pair comprising: a) a substrate bearing i) first and second conductive zones, wherein the first and second conductive zones define a first channel therebetween; and ii) third and fourth conductive zones, wherein the third and fourth conductive zones define a second channel therebetween; and b) a discrete semiconductor layer comprising an organic semiconductor on and adjacent to the first and second channels, where the discrete semiconductor layer serves exactly two single thin film semiconductor devices, where a majority of the discrete semiconductor layer lies to one side of and not on the first channel, and where a majority of the discrete semiconductor layer lies to one side of and not on the second channel.

DETAILED DESCRIPTION

The present disclosure provides a method of making a thin film semiconductor device comprising the steps of: a) providing a substrate bearing first and second conductive zones, wherein the first and second conductive zones define a channel therebetween and wherein the channel does not border more than 75% of the perimeter of either conductive zone; and b) depositing a discrete aliquot of a solution comprising an organic semiconductor adjacent to or on the channel, where the aliquot provides organic semiconductor to a single thin film semiconductor device, where a majority of the solution is deposited to one side of the channel and not on the channel. The present disclosure additionally provides a thin film semiconductor device, which comprises: a) a substrate bearing first and second conductive zones, wherein the first and second conductive zones define a channel therebetween, and wherein the channel does not border more than 75% of the perimeter of either conductive zone; and b) a discrete semiconductor layer comprising an organic semiconductor on and adjacent to the channel, where the discrete semiconductor layer serves a single thin film semiconductor device, where a majority of the discrete semiconductor layer lies to one side of and not on the channel.

The thin film device may be any suitable semiconductor device, including diodes, triodes such as transistors, or other multi-terminal devices. Most typically the device is a transistor. Where the device is a transistor, the first conductive zone is typically a source electrode and the second conductive zone is typically a drain electrode. The transistor typically includes a gate electrode. The transistor typically includes a dielectric layer interposed between the gate and the semiconductor layer.

The thin film device may have any suitable geometry, including top contact/bottom gate, bottom contact/bottom gate, top contact/top gate or bottom contact/top gate geometries disclosed in U.S. patent application Ser. No. 11/275,367, filed Dec. 28, 2005, the disclosure of which is incorporated herein by reference. In some embodiments, the thin film device has top contact/bottom gate geometry. In some embodiments, the thin film device has bottom contact/bottom gate geometry. In some embodiments, the thin film device has top contact/top gate geometry. In some embodiments, the thin film device has bottom contact/top gate geometry.

Figure 1:
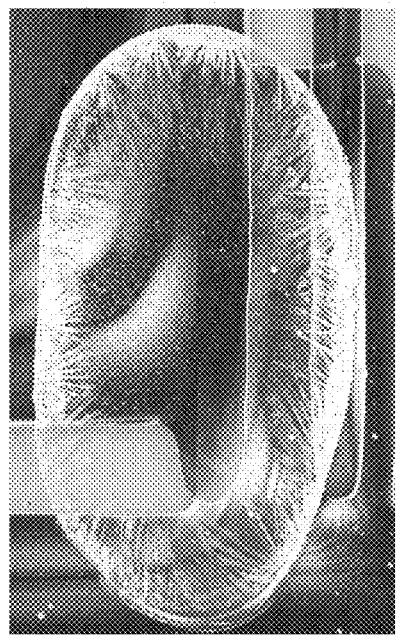
FIG. 1 is a photomicrograph of an inkjet-printed thin film transistor according to the present disclosure, further described in Example 1.
Figure 2:
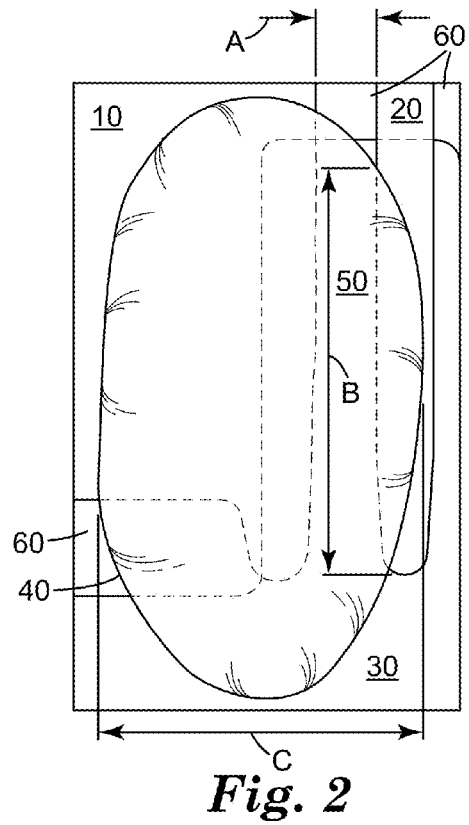
FIG. 2 is a schematic drawing of an inkjet-printed thin film transistor according to the present disclosure based on the photomicrograph of FIG. 1.

With reference to FIG. 2, in some embodiments the device according to the present disclosure comprises a channel 50 having length A and width B bordered by two conductive zones 10 and 20. Please note that, following standard terminology in the art, the word "length" designates the distance between the conductive zones even when it is the smaller dimension of the channel, i.e., smaller than the "width." Where the device is a transistor, these conductive zones 10 and 20 are typically the source and drain electrodes. In the embodiment depicted in FIG. 2, the device is built on a substrate 60 with bottom contact/bottom gate geometry. In this geometry, a conductive layer patterned to form gate 30 is applied to substrate 60 followed by a dielectric layer (which is transparent in FIG. 1 and therefore not visible in FIG. 2), a second conductive layer patterned to form source and drain 10 and 20, and finally discrete semiconductor layer 40.

With reference to FIG. 2, the channel length A is the distance across the channel 50 from one conductive zone 10 to the other conductive zone 20. Typically, the channel length is substantially constant. In some embodiments, a substantially constant channel length is constant by design and varies only by reason of material variation and external conditions. In some embodiments, a substantially constant channel length is constant +/−25%, in other embodiments +/−20%, in other embodiments +/−15%, in other embodiments +/−10%, in other embodiments +/−5%, in other embodiments +/−2.5%, in other embodiments +/−1%.

With reference to FIG. 2, the discrete semiconductor layer 40 has a length C which is about 5 times channel length A.

Please note that, the word "length" designates the dimension of the discrete semiconductor layer 40 that is the parallel to the length of the channel, even when it is the smaller dimension of discrete semiconductor layer 40, i.e., smaller than the "width." In some embodiments, length C of the discrete semiconductor layer 40 is between 2 and 50 times channel length A. In some embodiments, length C of the discrete semiconductor layer 40 is between 3 and 20 times channel length A. In some embodiments, length C of the discrete semiconductor layer 40 is between 4 and 10 times channel length A.

In some embodiments, the channel width is taken to be that width over which the channel has a substantially constant channel length. In some embodiments, the channel width is taken to be that width over which the channel overlays a gate electrode. In some embodiments, the channel width is taken to be that width over which the channel is spanned by semiconductor material. In some embodiments, the channel width is taken to be that width over which the channel meets some combination of the preceding conditions. In some embodiments, including that depicted in FIG. 2, channel width B is taken to be that width over which the channel 50 meets all three conditions: overlaying gate electrode 30, having a substantially constant channel length A and being spanned by semiconductor material. In the embodiments depicted in FIG. 2, channel width B terminates at its upper end where channel 50 is not spanned by semiconductor material and channel width B terminates at its lower end where channel 50 does not have substantially constant channel length A.

In some embodiments, the boundaries between the channel 50 and each of the conductive zones 10 and 20 are substantially linear, substantially parallel, or both.

For the purpose of this disclosure, conductive zones are distinguished from vias or conductive traces which may be electrically connected to the conductive zones. In some embodiments, the conductive zones may be defined to be only such parts of source or drain electrodes that overlay a gate electrode. The channel does not border more than 75% of the perimeter of either conductive zone. The channel of the device according to the present disclosure does not form a concentric ring geometry or Corbino geometry. In some embodiments, the channel does not border 60% or more of the perimeter of either conductive zone. In some embodiments, the channel does not border 50% or more of the perimeter of either conductive zone. In some embodiments, the channel does not border 40% or more of the perimeter of either conductive zone.

With reference to FIG. 2, in some embodiments the device according to the present disclosure comprises a discrete semiconductor layer 40 comprising an organic semiconductor. The discrete semiconductor layer 40 is located adjacent to or on the channel 50, where a majority of the discrete semiconductor layer 40 lies to one side of and not on the channel 50. As used herein, "to one side" means to a single side of the channel and not directly over the channel. In the embodiment depicted in FIG. 2, it can be seen that a major axis midline of the oval shape of the discrete semiconductor layer 40 lies over conductive zone 10 and not over channel 50, and therefore it may be concluded that a majority of the discrete semiconductor layer 40 lies to one side of and not on the channel 50; that is, a majority of the lateral area of the discrete semiconductor layer 40 lies to one side, where the lateral area is the area projected to a plane parallel to the substrate. In some embodiments more than 55% of the discrete semiconductor layer lies to one side of and not on the channel, in other embodiments more than 60%, in other embodiments more than 65%, in other embodiments more than 70%, in other embodiments more than 75%, in other embodiments more than 80%, in other embodiments more than 85%, in other embodiments more than 90%. Note that, for the purpose of this determination, the channel is considered to be unbounded in width.

In an alternate embodiment, a discrete semiconductor layer serves each of two back-to-back thin film semiconductor devices. In such embodiments, the discrete semiconductor layer is located between the channels of the two back-to-back thin film semiconductor devices. With regard to each of the two channels, a majority of the discrete semiconductor layer lies to one side of and not on the channel. In some embodiments more than 55% of the discrete semiconductor layer lies to one side of and not on each channel, in other embodiments more than 60%, in other embodiments more than 65%, in other embodiments more than 70%, in other embodiments more than 75%, in other embodiments more than 80%, in other embodiments more than 85%, in other embodiments more than 90%. In such an embodiment, the discrete semiconductor layer may later be separated into two portions, each serving one device. The separation may be by any suitable means, including cutting or scoring by knife, laser, or the like, or chemical means to remove or render non-conductive a center portion of the discrete semiconductor layer.

The discrete semiconductor layer includes an organic semiconductor material. Any suitable organic semiconductor material may be used, including those described in U.S. Pat. No. 6,690,029, U.S. patent application Ser. No. 11/275,366, filed Dec. 28, 2005, U.S. patent application Ser. No. 11/275,367, filed Dec. 28, 2005, U.S. Provisional Pat. App. No. 61/057,715, filed May 30, 2008, U.S. Provisional Pat. App. No. 61/060,595, filed Jun. 11, 2008, the disclosures of which are incorporated herein by reference. The semiconducting material may be a functionalized pentacene compound according to Formula I:

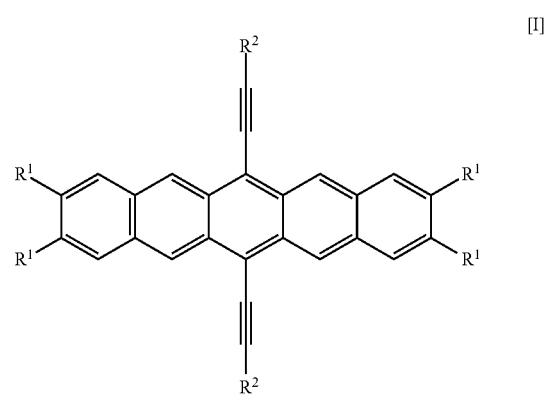

where each $R^1$ is independently selected from H and $CH_3$ and each $R^2$ is independently selected from branched or unbranched, linear or cyclic C2-C18 alkanes, branched or unbranched C1-C18 alkyl alcohols, branched or unbranched, linear or cyclic C2-C18 alkenes, C4-C8 aryls or heteroaryls, C5-C32 alkylaryl or alkyl-heteroaryl, a ferrocenyl, or $SiR^3{}_3$ where each $R^3$ is independently selected from hydrogen, branched or unbranched C1-C10 alkanes, branched or unbranched, linear or cyclic C1-C10 alkyl alcohols or branched or unbranched C2-C10 alkenes. Typically each $R^1$ is H. Typically, each $R^2$ is $SiR^3{}_3$. More typically each $R^2$ is $SiR^3{}_3$ and each $R^3$ is independently selected from branched or unbranched, linear or cyclic C1-C10 alkanes or alkenes. Most typically, the compound is 6,13-bis(triisopropylsilylethynyl) pentacene (TIPS-pentacene), shown in formula II:

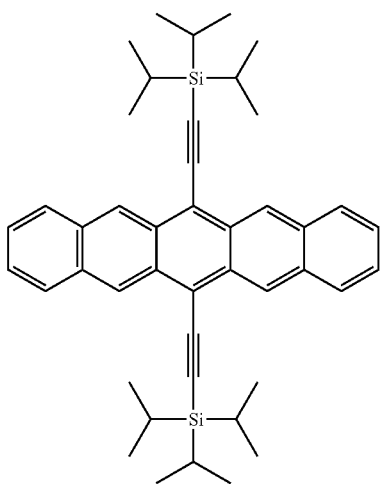

In some embodiments, each $R^2$ is independently selected from $-SiR^4_xR^5_yR^6_z$, wherein:

each $R^4$ independently comprises (i) a branched or unbranched, substituted or unsubstituted C1-C8 alkyl group, (ii) a substituted or unsubstituted cycloalkyl group, or (iii) a substituted or unsubstituted cycloalkylalkylene 5 group; each $R^5$ independently comprises (i) a branched or unbranched, substituted or unsubstituted C2-C8 alkenyl group, (ii) a substituted or unsubstituted cycloalkyl group, or (iii) a substituted or unsubstituted cycloalkylalkylene group; each $R^6$ comprises (i) hydrogen, (ii) a branched or unbranched, substituted or unsubstituted C2-C8 alkynyl group, (iii) a substituted or unsubstituted cycloalkyl group, (iv) a substituted or unsubstituted cycloalkylalkylene group, (v) a substituted aryl group, (vi) a substituted or unsubstituted arylalkylene group, (vii) an acetyl group, or (viii) a substituted or unsubstituted heterocyclic ring comprising at least one of O, N, S and Se in the ring; x=1 or 2; y=1 or 2; z=0 or 1; and (x+y+z)=3.

The discrete semiconductor layer typically contains the compound of Formula I or of Formula II in an amount of 0.1-99% by weight.

In some embodiments, the discrete semiconductor layer may include additional materials such as suitable polymers. In some embodiments, a polymer additive has a dielectric constant at 1 kHz of greater than 1.0, more typically greater than 3.3, more typically greater than 3.5, and more typically greater than 4.0. The polymer typically has a M.W. of at least 1,000 and more typically at least 5,000. Typical polymers include poly(4-cyanomethyl styrene) and poly(4-vinylphenol). In some embodiments, cyanopullulans may also be used.

Typical polymers also include those described in U.S. Patent Publication No. 2004/0222412 A1, incorporated herein by reference. Polymers described therein include substantially nonfluorinated organic polymers having repeat units of the formulas:

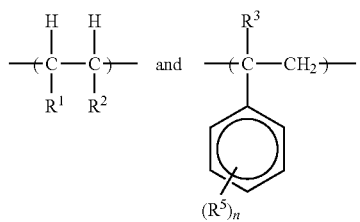

wherein:

[II]

each $R^1$ is independently H, Cl, Br, I, an aryl group, or an organic group that includes a crosslinkable group;
each $R^2$ is independently H, an aryl group, or $R^4$;
each $R^3$ is independently H or methyl;
each $R^5$ is independently an alkyl group, a halogen, or $R^4$;
each $R^4$ is independently an organic group comprising at least one CN group and having a molecular weight of about 30 to about 200 per CN group; and
n=0-3;

with the proviso that at least one repeat unit in the polymer includes an $R^4$. Other polymers which may be used may also include polystyrene, poly(α-methylstyrene), poly(α-vinylnaphthalene), poly(vinyltoluene), polyethylene, cis-polybutadiene, polypropylene, polyisoprene, poly(4-methyl-1-pentene), poly(4-methylstyrene), poly(chorotrifluoroethylene), poly(2-methyl-1,3-butadiene), poly(p-xylylene), poly(α-α-α'-α'tetrafluoro-p-xylylene), poly[1,1-(2-methyl propane) bis(4-phenyl)carbonate], poly(cyclohexyl methacrylate), poly(chlorostyrene), poly(2,6-dimethyl-1,4-phenylene ether), polyisobutylene, poly(vinyl cyclohexane), poly(vinylcinnamate), poly(4-vinylbiphenyl), poly(1,2-butadiene), polyphenylene, poly(methyl methacrylate), and polyvinyl phenol.

Copolymers of the above materials may also be useful. For example, polymers of styrene and α-methyl styrene; copolymers including styrene, α-methylstyrene and butadiene, for example. Both random or block copolymers can be used. Exemplary copolymers include, but are not limited to, poly(ethylene/tetrafluoroethylene); poly(ethylene/chlorotrifluoro-ethylene); fluorinated ethylene/propylene copolymer; polystyrene-co-α-methylstyrene; ethylene/ethyl acrylate copolymer; poly(styrene/10% butadiene); poly(styrene/15% butadiene); poly(styrene/2,4 dimethylstyrene); cyclic olefin copolymers such as those commercially available from Dow Chemical under the trade designation TOPAS (all grades); branched or non-branched polystyrene-block-polybutadiene; polystyrene-block (polyethylene-ran-butylene)-block-polystyrene; polystyrene-block-polybutadiene-block-polystyrene; polystyrene-(ethylene-propylene)-diblock-copolymers (e.g. KRATON-G1701E, Kraton Polymers U.S. LLC, Houston, Tex.); poly(propylene-co-ethylene); and poly(styrene-co-methylmethacrylate).

The discrete semiconductor layer may contain the polymer in an amount of 0-99.9% by weight, more typically 10-90% by weight, more typically 20-50% by weight.

In the method of the present disclosure, a discrete aliquot of a solution comprising an organic semiconductor is deposited adjacent to or on the channel. In a typical embodiment, each such aliquot provides organic semiconductor to a single thin film semiconductor device.

Any suitable organic semiconductor may be used, as discussed above.

In some embodiments, the solution may additionally include a polymer such as discussed above. In some embodiments, a semiconductor crystal growth solution may be used, as disclosed in U.S. Provisional Pat. App. No. 61/076,186, filed Jun. 27, 2008, the disclosure of which is incorporated herein by reference.

Any suitable solvent may be used, which may include ketones, aromatic hydrocarbons, and the like, and may include mixtures thereof. Typically the solvent is organic. Typically the solvent is aprotic. Suitable solvents may include, but are not limited to, toluene, ethylbenzene, butylbenzene, chlorobenzene, dichlorobenzene, anisole, tetrahydronaphthalene, cyclohexanone and mixtures thereof. In some single solvent embodiments, the solution comprises at least 95% by weight of a single solvent.

Mixed solvent systems may be used, as disclosed in U.S. Provisional Pat. App. No. 61/060,595, filed Jun. 11, 2008, the disclosure of which is incorporated herein by reference.

Any suitable amount of organic semiconductor may be deposited in the method of the present disclosure or present in the device of the present disclosure. Greater amounts may generate thicker and/or more crystalline semiconductor layers in the final device. In some embodiments, the volume of the discrete aliquot of solution comprising an organic semiconductor is between 15 pL and 40 nL. In some embodiments, the volume of the discrete aliquot of solution comprising an organic semiconductor is at least 15 pL, more typically at least 25 pL, more typically at least 50 pL, more typically at least 250 pL, and in some embodiments 500 pL or more. In some embodiments, the volume of the discrete aliquot of solution comprising an organic semiconductor is not more than 40 nL, more typically not more than 10 nL, more typically not more than 4 nL, more typically not more than 1 nL.

In the method of the present disclosure, the discrete aliquot of a solution comprising an organic semiconductor may be deposited by any suitable method. In some embodiments, the discrete aliquot is deposited as a single drop or droplet. Such embodiments may include inkjet printing, micropipetting, flexographic printing, and the like. In some embodiments, the discrete aliquot is deposited in the form of a plurality of droplets. Such embodiments also may include inkjet printing, micropipetting, flexographic printing, and the like.

Inkjet printing is well known, e.g., for printing graphics, including multi-color graphics. Inkjet printing enables precise positioning of very small drops of ink. Any suitable inkjet printing system may be used in the practice of the present invention, including thermal, piezoelectric, and continuous inkjet systems. Most typically a piezoelectric inkjet system is used. Inks useful in inkjet printing are typically free of particulates greater than 500 nm in size and more typically free of particulates greater than 200 nm in size.

In the method of the present disclosure, the discrete aliquot of a solution comprising an organic semiconductor is deposited adjacent to or on the channel, with a majority of the solution deposited to one side of the channel and not on the channel. As used herein, "to one side" means to a single side, outside the channel. As used herein, the location of deposition is the initial location of deposition notwithstanding subsequent flow or wetting out. In some embodiments of the method according to the present disclosure, more than 55% of the solution is deposited to one side of the channel and not on the channel, in other embodiments more than 60%, in other embodiments more than 65%, in other embodiments more than 70%, in other embodiments more than 75%, in other embodiments more than 80%, in other embodiments more than 85%, in other embodiments more than 90%, in other embodiments more than 95%. In some embodiments all of the solution is deposited to one side of the channel and not on the channel. In embodiments where the discrete aliquot is deposited in the form of a plurality of droplets, which may include inkjet printing, more than 50% of the droplets are deposited to one side of the channel and not on the channel, in other embodiments more than 55%, in other embodiments more than 60%, in other embodiments more than 65%, in other embodiments more than 70%, in other embodiments more than 75%, in other embodiments more than 80%, in other embodiments more than 85%, in other embodiments more than 90%, in other embodiments more than 95%. In some embodiments all of the droplets are deposited to one side of the channel and not on the channel.

In some embodiments of the method according to the present disclosure, the discrete aliquot of a solution comprising an organic semiconductor has a length, after deposition and wetting out on the surface, which is about 5 times the channel length. In some embodiments, the length is between 2 and 50 times the channel length. In some embodiments, the length is between 3 and 20 times the channel length. In some embodiments, the length is between 4 and 10 times the channel length.

In some embodiments of the method according to the present disclosure, inkjet printed layers such as the gate, dielectric, source/drain and semiconductor layers are printed from images, typically comprised of rectilinear matrices of pixels, which determine the deposit locations for the inkjet deposited solutions. In some embodiments of the method according to the present disclosure, the image of the deposit location for the solution comprising the organic semiconductor has a length between 0.05 and 5 times the channel length. Please note again that the word "length" designates the dimension that is the parallel to the length of the channel, even when the length of the image of the deposit location is the smaller dimension, i.e., smaller than the "width." In some embodiments of the method according to the present disclosure, the image of the deposit location for the solution comprising the organic semiconductor has a length that is less than the channel length. In some embodiments of the method according to the present disclosure, the image of the deposit location for the solution comprising the organic semiconductor has a length that is less than one half the channel length. In some embodiments of the method according to the present disclosure, the image of the deposit location for the solution comprising the organic semiconductor has a length between 0.1 and 0.9 times the channel length. In some embodiments of the method according to the present disclosure, the deposit location for the solution comprising the organic semiconductor has a length between 0.05 and 5 times the channel length. In some embodiments of the method according to the present disclosure, the deposit location for the solution comprising the organic semiconductor has a length that is less than the channel length. In some embodiments of the method according to the present disclosure, the deposit location for the solution comprising the organic semiconductor has a length that is less than one half the channel length. In some embodiments of the method according to the present disclosure, the deposit location for the solution comprising the organic semiconductor has a length between 0.1 and 0.9 times the channel length.

It follows from the preceding that, in some embodiments of the method according to the present disclosure, the solution comprising the organic semiconductor is deposited entirely outside of the channel and deposited in a band having a length that is less than the channel length.

Objects and advantages of this invention are further illustrated by the following examples, but the particular materials and amounts thereof recited in these examples, as well as other conditions and details, should not be construed to unduly limit this invention.

EXAMPLES

Unless otherwise noted, all reagents were obtained or are available from Aldrich Chemical Co., Milwaukee, Wis., or may be synthesized by known methods.

Examples 1 and 2C

Figure 4:
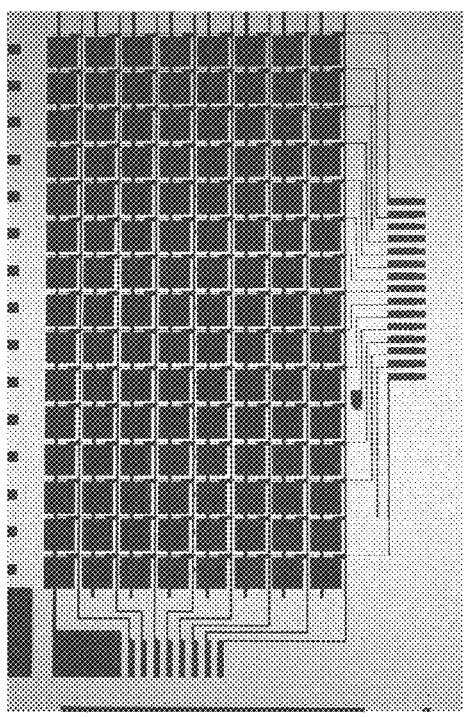
FIG. 4 is a photomicrograph of an all inkjet-printed backplane, further described in Example 1.

A sheet containing two backplanes was fabricated by inkjet printing every layer—gate, dielectric, source/drain and semiconductor—onto a flexible polymeric substrate by the process described below. Each backplane contained 8 rows and 15 columns of transistors (120 transistor total) at a pitch of 3.0 mm. FIG. 4 is a digital photograph of one of the inkjet-printed backplanes.

The first of the two backplanes, Example 1, represented the present disclosure and the second, Comparative Example 2C, was comparative.

Each inkjet printed layer—gate, dielectric, source/drain and semiconductor—was printed from an image created in Adobe® Photoshop® (Adobe Systems, San Jose, Calif.). Each image was created as a rectilinear matrix of pixels for use with a 702 dpi (276 pixels per cm) print system. Thus, each pixel had an initial width of 36.2 microns.

The source/drain layer image included transistor channels having a channel length of 6 pixels, or 217 microns. As printed, the source/drain layer material wetted out laterally, reducing the channel length to approximately 128 microns in the printed backplane. Average measured channel length for Examples 1 and 2C were 120 microns and 136 microns, respectively. Average measured channel width for Examples 1 and 2C were 780 microns and 910 microns, respectively.

Figure 5:
FIG. 5 is a schematic representation of a matrix of pixels designed to inkjet-print a discrete aliquot of organic semiconductor solution, further described in Example 1 and Comparative Example 2C.

The semiconductor layer image was designed to deposit discrete aliquots of organic semiconductor solution, each providing organic semiconductor to a single transistor. FIG. 5 schematically represents the semiconductor image used for each aliquot, which was 25 pixels in width and 2 pixels in length and included 18 printed pixels representing 18 drops of organic semiconductor solution deposited on the backplane. Each drop had a volume of 30 pL, for a total volume of 540 pL. As printed, this matrix of drops wetted out laterally to form a single continuous deposit, roughly oval in shape, having a width of approximately 1200 microns and a length of approximately 650 microns. These deposits are visible as translucent ovals in both of FIGS. 1 and 3 and represented by index number 40 in FIG. 2, which is based on FIG. 1.

Figure 3:
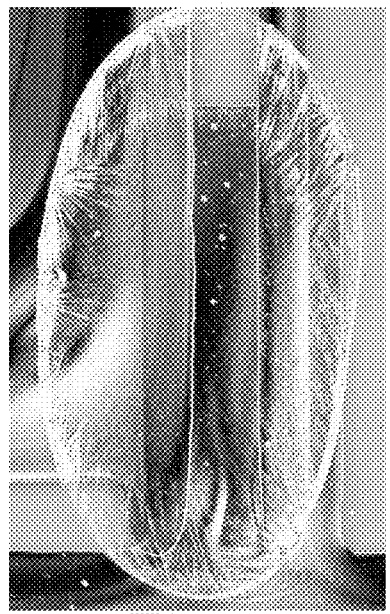
FIG. 3 is a photomicrograph of a comparative inkjet-printed thin film transistor, further described in Comparative Example 2C.

In the backplane of Comparative Example 2C, the width of the semiconductor image was centered over the width of the channel. FIG. 3 is a photomicrograph of one transistor in the backplane of Comparative Example 2C.

In the backplane of Example 1, the width of the semiconductor image was offset from the center of the channel by five pixels, or about 180 microns. The offset was made in the design of the semiconductor image itself and not in the printing process. It follows that none of the semiconductor solution was deposited directly in the channel by inkjet printing. Instead, the printed matrix of drops wetted out laterally to form a single continuous deposit which extended across the channel. FIG. 1 is a photomicrograph of one transistor in the backplane of Example 1.

Inspection of FIGS. 1 and 3 suggests that the edge of each deposit exhibited a strong crystalline morphology while the center was amorphous. Thus, the offset semiconductor deposit in Example 1 appears to position a substantial amount of crystalline material over the channel. Inspection of FIGS. 1 and 3 suggests that a rectangular semiconductor layer image, resulting in an oval deposit of semiconductor material, exhibits more parallelism of crystalline structure down its long side than its short side. Thus, generating a long side and positioning the long side over the channel as in Example 1 appears to position more parallel crystalline material over the channel in a channel-crossing direction. Transistors of Example 1 demonstrated dramatically improved mobility over transistors of Comparative Example 2C, as described in the quantitative test results which follow the process description below.

Process

An 8"×8" piece of DuPont Teonex® Q65 4 mil thick PEN film was fastened between two pieces of stainless steel. The two pieces of stainless steel clamp around the perimeter of the PEN film. These clamps help minimize the shrinkage in the PEN film throughout the process. Both sides of the clamped PEN film were cleaned numerous times with absolute ethanol in order to reduce particle contamination and to provide a clean surface with a constant surface energy. After cleaning, the clamped film was then fastened with four screws into the XY deposition system on an aluminum vacuum table. After the clamped film was placed in the system it is cleaned one more time with ethanol.

A Spectra-Dimatix SX3-128 printhead was then inserted into the system. The SX3-128 printhead has 128 jets with a 10 pL drop volume. The printhead was filled with approximately 20.0 mL of Cabot Ag-IJ-G-100-S1 inkjetable silver conductor ink. This material served as the gate layer of the backplane. Once the printhead was in the system the height and sabre angle were adjusted. The printhead height was adjusted to approximately 1.0 mm above the surface of the PEN film. The sabre angle was adjusted to give a desired resolution of 702 dpi. Upon completion of the aforementioned, the substrate was registered. The corner of the stainless steel clamp was used as the starting point or origin. From the origin a 1.0 inch offset was set in the negative x and y direction. This was the location where the printhead started printing the conductive ink or patterned gate layer.

Before the application of the conductive ink, the substrate was pre-shrunk. The purpose of pre-shrinking the substrate was for improved registration. Shrinking of the film between the thermal curing of each layer affects registration of subsequent layers. The pre-shrinking process included thermally heating the film from the bottom and the top of the substrate. Heating from below was done with an online hot plate set to 125° C. Heating from above the substrate was done with a 500 Watt/inch infrared lamp. Once the hot plate reached 125° C., the IR lamp scanned over the substrate 5 times with a velocity of 2.0 in./sec and at a 100% power level. This process took 25 seconds and the maximum temperature of the substrate reached 140° C., which was recorded by an infrared pyrometer.

Upon completion of the pre-shrinking process, the substrate/aluminum platen was cooled to a temperature of 45° C. in preparation for deposition of the silver gate layer. Printing the silver ink while the platen is at an elevated temperature prevents the silver ink from wetting out excessively on the PEN film substrate. Once the patterned gate layer is deposited onto the substrate it sat at 45° C. for 5.0 minutes. This allowed the material to settle, thus producing a more uniform layer for subsequent deposition processes.

After the silver sat for 5.0 minutes, it was sintered with the online hot plate and infrared lamp. The hot plate was set to 125° C. and then the IR lamp scanned over the patterned image 5 times at a velocity of 2.0 in/sec. and at 100% power. The purpose of heating the substrate to 125° C. before sintering the silver with the IR lamp was to decrease the sintering time. It took approximately 25 seconds to sinter the silver with the IR lamp. After the silver was sintered, the temperature of the hot plate was set to 150° C. The substrate remained at this temperature for 10 minutes. The purpose of this step was to verify all of the solvent is out of the silver nanoparticle ink, which is 20% Ag, 40% ethanol and 40% ethylene glycol.

The next layer in the fabrication of the all-inkjet printed backplane was the dielectric layer. After thermally curing the gate layer, the SX3-128 printhead was removed and replaced with a Spectra-Dimatix SE-128 printhead. This printhead was used for printing the dielectric material, which was a zirconia acrylate in isophorone. The SE-128 has 128 jets and a 30 pL drop volume. The height was set to approximately 1.0 mm above the substrate and the sabre angle was set to produce a resolution of 702 dpi. The platen temperature was reduced to 26° C. Printing the dielectric layer at too high of a temperature reduces wetting. Insufficient wetting produces holes in the dielectric layer, which can lead to undesired shorts in the thin-film transistors.

Before printing the dielectric layer, a test print was printed for registering the dielectric layer relative to the patterned gate layer. The test print was compared to another test print that was printed with the gate layer. The measured difference between the two test prints determined where printing of the dielectric layer began.

Once registration is completed a blanket coat of dielectric material was printed onto the gate layer. Upon completion of printing, the material was immediately dried, cured and dried again. The first drying process or pre-bake was done with the online hot plate and IR lamp. Once the hot plate reached a temperature of 75° C. the IR lamp scanned over the printed image two times at a velocity of 2.0 in/sec and at 40% power. The IR step in this process was low temperature because increasing the intensity of this step could cause the dielectric layer to 'skin over' and trap the solvent. Therefore, most of the drying was done thermally from below the substrate. After the infrared lamp scanned over the sample, the platen temperature remained at 75° C. for an additional 10 minutes. This step in the process was utilized for removing any remaining solvent. After the solvent was removed from the dielectric material it was cured or cross-linked at a platen temperature of 45° C. This was accomplished with a 250 nm wavelength UV germicidal lamp with a nitrogen purge for 401 seconds. The final drying step or post-bake used the same process steps as the previously mentioned pre-bake except the IR lamp scanned over the image 5 times at 2.0 in./sec and at 100% power.

Upon completion of the dielectric layer, the SE-128 printhead was removed from the system and replaced with the SX3-128 printed for deposition of the source and drain layer. The source/drain layer was also printed with Cabot Silver. The height of the printhead was adjusted to approximately 1.0 mm above the substrate and the sabre angle was set for a resolution of 702 dpi. The source/drain layer was printed twice.

For printing of the first source/drain layer, the aluminum platen was cooled to 45° C. and registration was done in the same manner as previously mentioned for the dielectric layer. Once printing completed, the platen temperature was raised to 60° C. for 30 seconds. This sintered the silver along the edges before completely sintering the material at a higher temperature. After 30 seconds the platen temperature was raised to 150° C. for 10 minutes.

For the second printed source/drain layer, not every image or feature was printed twice. The drain lines were only printed once, whereas the source pads were printed twice. The source pads were printed twice due to non-uniformity after the sintering of the first layer. The platen was set to 150° C. for 10 minutes to sinter the silver.

Before the process of printing the semiconductor, the platen was cooled to 30° C. and a surface treatment was applied to the dielectric material and the source/drain contacts. High purity toluene was deposited onto the surface of the entire sample with a pipette and left on the sample for 1.0 minute. After 1.0 minute the toluene was removed by blowing it off with an air can. Next, a solution of 1.0 mmol perfluorothiolphenol in high purity toluene was deposited on the surface of the entire sample and left for 1.0 minute. The solution was removed by blowing it off with an air can. The previous step was then repeated. For the final step, high purity toluene was deposited on the entire surface of the substrate for 20 seconds. After 20 seconds the toluene was blown off the sample with an air can. This treatment cleaned any residue on the contacts and provided a favorable surface energy for the semiconductor solution.

Upon completion of the surface treatment, the SX3-128 printhead was removed from the system and replaced with an SE-128 printhead. The printhead was filled with solution in n-butylbenzene of 1.0 wt % polystyrene and 2.0 wt % of an organic semiconductor, 6,13-bis(triisopropylsilyethynyl) pentacene. The height and sabre angle were adjusted to the specifications previously mentioned. Registration of the semiconductor layer was completed as previously mentioned for the other layers.

Before deposition of the semiconductor a preheat step was initiated in order to remove any solvent, toluene, that remained on the substrate after the surface treatment. This preheat step was completed with the online infrared lamp at 6 passes, 2.0 in/sec and 80% power. Once completed, the platen was cooled to 30° C.

As noted above, 18 drops or 540 pL of semiconductor solution was deposited onto each transistor.

Results

Figure 6:
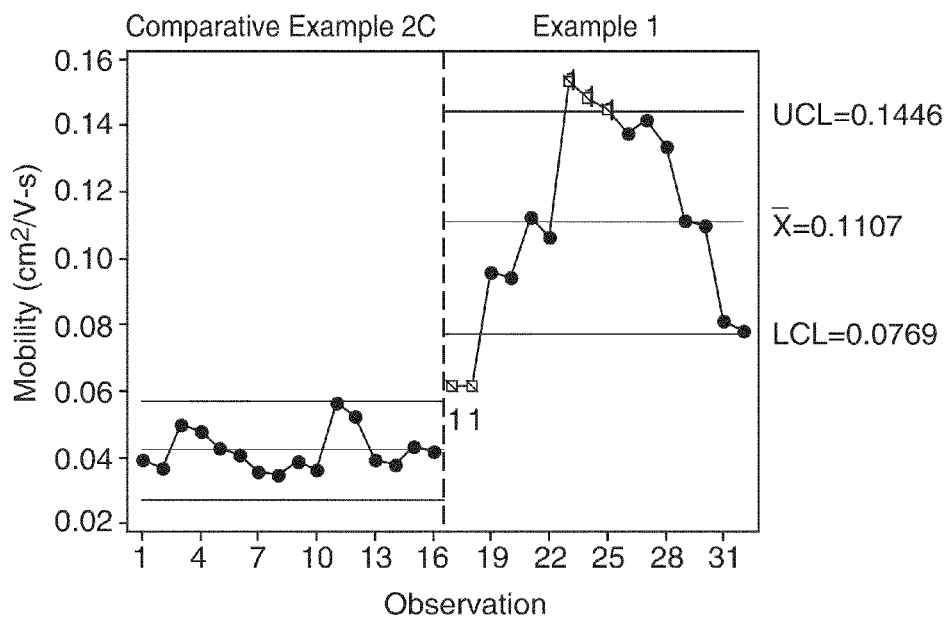
FIG. 6 is a graph presenting mobility values for transistors of Example 1 and Comparative Example 2C.
Figure 7:
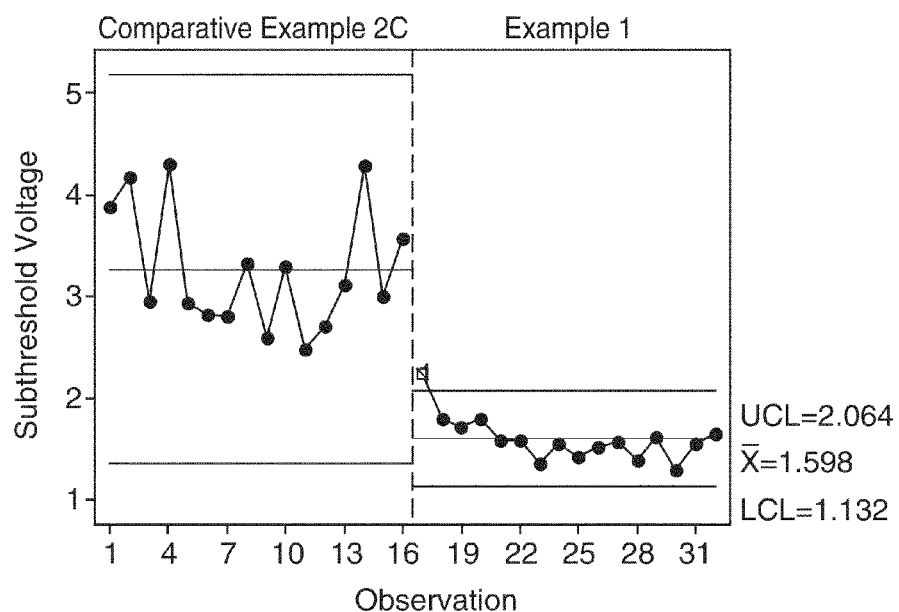
FIG. 7 is a graph presenting sub-threshold voltage values for transistors of Example 1 and Comparative Example 2C.
Figure 8:
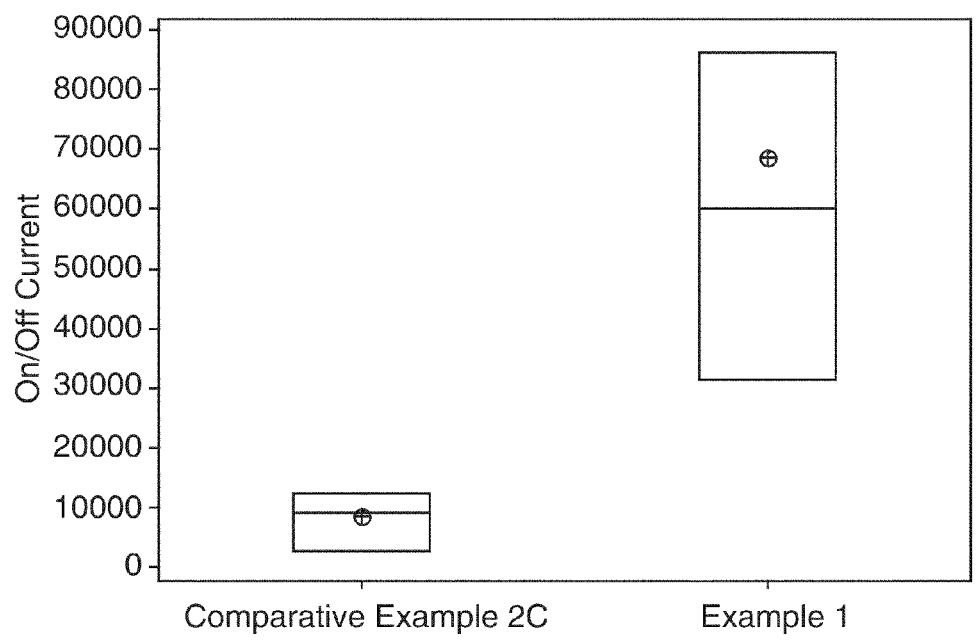
FIG. 8 is a graph presenting on/off current values for transistors of Example 1 and Comparative Example 2C.

Transistors were measured with saturated $I_d$-$V_g$ curves. The gate voltage was biased from 10V to −40V and the drain voltage was set to −40V. The average mobility of transistors of Comparative Example 2C was 0.042 cm$^2$/V-s, whereas, the average mobility of transistors of Example 1 was 0.11 cm$^2$/V-s. FIG. 6 is a graph presenting mobility values for transistors of Example 1 and Comparative Example 2C. The transistors according to the present disclosure demonstrated greater mobility. FIG. 7 is a graph presenting sub-threshold voltage values for transistors of Example 1 and Comparative Example 2C. The transistors according to the present disclosure demonstrated reduced sub-threshold voltage. FIG. 8 is a graph presenting on/off current ratio values for transistors of Example 1 and Comparative Example 2C. The transistors according to the present disclosure operated at greater on/off current ratio values.

Various modifications and alterations of this invention will become apparent to those skilled in the art without departing from the scope and principles of this invention, and it should be understood that this invention is not to be unduly limited to the illustrative embodiments set forth hereinabove.

We claim:

1. A method of making a thin film semiconductor device comprising the steps of:
    a) providing a substrate bearing first and second conductive zones, wherein the first and second conductive zones define a channel therebetween and wherein the channel does not border more than 75% of the perimeter of either conductive zone; and
    b) depositing a discrete aliquot of a solution comprising an organic semiconductor adjacent to or on the channel, where the aliquot provides organic semiconductor to a single thin film semiconductor device, where a majority of the solution is deposited to one side of the channel and not on the channel.

2. The method according to claim 1 wherein the channel does not border 50% or more of the perimeter of either conductive zone.

3. The method according to claim 1 wherein the boundaries between the channel and each of the conductive zones are substantially linear and substantially parallel.

4. The method according to claim 1 wherein the thin film semiconductor device is a transistor, the first conductive zone is a source and the second conductive zone is a drain.

5. The method according to claim 1 wherein more than 70% of the solution is deposited to one side of the channel and not on the channel.

6. The method according to claim 1 wherein more than 90% of the solution is deposited to one side of the channel and not on the channel.

7. The method according to claim 1 wherein all of the solution is deposited to one side of the channel and not on the channel.

8. The method according to claim 1 wherein the discrete aliquot is deposited in the form of a plurality of droplets.

9. The method according to claim 8 wherein the droplets are deposited by inkjet printing.

10. The method according to claim 9 wherein at least 70% of the droplets are deposited to one side of and not on the channel.

11. The method according to claim 9 wherein at least 90% of the droplets are deposited to one side of and not on the channel.

12. The method according to claim 9 wherein all of the droplets are deposited to one side of and not on the channel.

13. The method according to claim 1 wherein the channel has a channel length and wherein the discrete aliquot of a solution comprising an organic semiconductor is allowed to wet out after deposition and thereupon has a length that is not more than 10 times the channel length.

14. The method according to claim 1 wherein the channel has a channel length and wherein the discrete aliquot of a solution comprising an organic semiconductor is deposited in a band having a length that is less than the channel length.

15. The method according to claim 1 wherein the channel has a channel length, wherein the discrete aliquot of a solution comprising an organic semiconductor is deposited in a band having a length that is less than the channel length, and wherein all of the solution is deposited to one side of the channel and not on the channel.

16. A thin film semiconductor device comprising:
   a) a substrate bearing first and second conductive zones, wherein the first and second conductive zones define a channel therebetween and wherein the channel does not border more than 75% of the perimeter of either conductive zone; and
   b) a discrete semiconductor layer comprising an organic semiconductor on and adjacent to the channel, where the discrete semiconductor layer serves a single thin film semiconductor device, where a majority of the discrete semiconductor layer lies to one side of and not on the channel.

17. The device according to claim 16 wherein the channel does not border 50% or more of the perimeter of either conductive zone.

18. The device according to claim 16 wherein the boundaries between the channel and each of the conductive zones are substantially linear and substantially parallel.

19. The device according to claim 16 wherein the thin film semiconductor device is a transistor, the first conductive zone is a source and the second conductive zone is a drain.

20. The device according to claim 19 additionally comprising a gate and a dielectric layer.

21. The method according to claim 16 wherein more than 55% of the discrete semiconductor layer lies to one side of and not on the channel.

22. The method according to claim 16 wherein more than 60% of the discrete semiconductor layer lies to one side of and not on the channel.

23. The method according to claim 16 wherein more than 70% of the discrete semiconductor layer lies to one side of and not on the channel.

24. The method according to claim 16 wherein more than 80% of the discrete semiconductor layer lies to one side of and not on the channel.

25. The device according to claim 16 wherein channel has a channel length and wherein the discrete semiconductor layer has a length that is not more than 10 times the channel length.

26. A method of making a thin film semiconductor device pair comprising the steps of:
   a) providing a substrate bearing
      i) first and second conductive zones, wherein the first and second conductive zones define a first channel therebetween; and
      ii) third and fourth conductive zones, wherein the third and fourth conductive zones define a second channel therebetween; and
   b) depositing a discrete aliquot of a solution comprising an organic semiconductor adjacent to or on the first and second channels, where the aliquot provides organic semiconductor to exactly two single thin film semiconductor devices, where a majority of the solution is deposited to one side of the first channel and not on the first channel, and where a majority of the solution is deposited to one side of the second channel and not on the second channel.

27. A thin film semiconductor device pair comprising:
   a) a substrate bearing
      i) first and second conductive zones, wherein the first and second conductive zones define a first channel therebetween; and
      ii) third and fourth conductive zones, wherein the third and fourth conductive zones define a second channel therebetween; and
   b) a discrete semiconductor layer comprising an organic semiconductor on and adjacent to the first and second channels, where the discrete semiconductor layer serves exactly two single thin film semiconductor devices, where a majority of the discrete semiconductor layer lies to one side of and not on the first channel, and where a majority of the discrete semiconductor layer lies to one side of and not on the second channel.

* * * * *

UNITED STATES PATENT AND TRADEMARK OFFICE
CERTIFICATE OF CORRECTION

| | | |
|---|---|---|
| PATENT NO. | : 7,948,016 B1 | Page 1 of 1 |
| APPLICATION NO. | : 12/611556 | |
| DATED | : May 24, 2011 | |
| INVENTOR(S) | : Scott M Schnobrich et al. | |

It is certified that error appears in the above-identified patent and that said Letters Patent is hereby corrected as shown below:

Title Page
Please add the following:
    Item -- (65) Prior Publication Data
    US 2011/0101311 A1   May 05, 2011 -- therefor.

Column 14
Line 13; delete "triisopropylsilyethynyl" and
    insert -- triisopropylsilylethynyl -- therefor.

Signed and Sealed this
Twenty-third Day of August, 2011

David J. Kappos
*Director of the United States Patent and Trademark Office*